US012604579B2

(12) United States Patent
Hung et al.

(10) Patent No.: US 12,604,579 B2
(45) Date of Patent: Apr. 14, 2026

(54) LIGHT EMITTING PACKAGE STRUCTURE

(71) Applicant: LITE-ON TECHNOLOGY CORPORATION, Taipei (TW)

(72) Inventors: Wei-Chien Hung, Taipei (TW); Chien-Tung Huang, Taipei (TW); Hou-Chuan Tsai, Taipei (TW); Wei-Hsun Hsu, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 751 days.

(21) Appl. No.: 17/706,376

(22) Filed: Mar. 28, 2022

(65) Prior Publication Data

US 2022/0320392 A1     Oct. 6, 2022

Related U.S. Application Data

(60) Provisional application No. 63/180,055, filed on Apr. 26, 2021, provisional application No. 63/168,266, filed on Mar. 31, 2021.

(30) Foreign Application Priority Data

Feb. 25, 2022    (CN) .......................... 202220421480.9

(51) Int. Cl.
    *H10H 20/856*      (2025.01)
    *H01L 25/075*      (2006.01)
    *H10H 20/851*      (2025.01)
    *H10H 20/855*      (2025.01)
    *H10H 20/857*      (2025.01)
    *H10H 20/80*       (2025.01)

(52) U.S. Cl.
    CPC ....... *H10H 20/856* (2025.01); *H01L 25/0753* (2013.01); *H10H 20/851* (2025.01); *H10H 20/855* (2025.01); *H10H 20/857* (2025.01); *H10H 20/882* (2025.01)

(58) Field of Classification Search
    CPC ................................................. H10H 20/8514
    See application file for complete search history.

(56) References Cited

U.S. PATENT DOCUMENTS

| | | | | |
|---|---|---|---|---|
| 10,014,450 B1 * | 7/2018 | Mak | .................... | H10H 20/8514 |
| 2007/0085103 A1 * | 4/2007 | Nishioka | ............ | H10H 29/8513 |
| | | | | 257/E33.072 |
| 2011/0175117 A1 * | 7/2011 | Jagt | ...................... | H10H 20/841 |
| | | | | 257/E33.061 |
| 2017/0328525 A1 * | 11/2017 | Herrmann | ........... | H01L 25/0753 |

(Continued)

*Primary Examiner* — Benjamin P Sandvik
(74) *Attorney, Agent, or Firm* — Innovation Counsel LLP

(57) ABSTRACT

A light emitting package structure includes a light emitting unit, a reflective layer, a reflective element and an optical layer. The light emitting unit has a top surface, a bottom surface and sidewall surfaces. The bottom surface and the top surface are opposing to each other. The sidewall surfaces are between the top surface and the bottom surface. The light emitting unit further has an electrode portion on the bottom surface. The reflective layer encloses the sidewall surfaces of the light emitting unit. The reflective element is disposed on the light emitting unit and the reflective layer. The optical layer includes a phosphor layer, a light diffusion layer or a combination thereof. The optical layer is disposed between the top surface of the light emitting unit and the reflective element.

14 Claims, 7 Drawing Sheets

(56)          References Cited

U.S. PATENT DOCUMENTS

| | | | |
|---|---|---|---|
| 2018/0175255 A1* | 6/2018 | Morikawa | H01L 25/0753 |
| 2020/0052171 A1* | 2/2020 | Ye | H10H 20/853 |
| 2020/0235079 A1* | 7/2020 | Lee | H10H 20/855 |
| 2022/0173271 A1* | 6/2022 | Noma | H10H 29/41 |
| 2022/0178519 A1* | 6/2022 | Chen | H05K 1/181 |

* cited by examiner

LIGHT EMITTING PACKAGE STRUCTURE

This application claims the benefit of U.S. provisional application Ser. No. 63/168,266, filed Mar. 31, 2021, and U.S. provisional application Ser. No. 63/180,055, filed Apr. 26, 2021, and People's Republic of China application Serial No. 202220421480.9, filed Feb. 25, 2022, the subject matters of which are incorporated herein by references.

BACKGROUND

Technical Field

The disclosure relates to a light emitting package structure.

Description of the Related Art

The packaging technology for a light-emitting diode (LED) is one of the key development technologies of the semiconductor industry at present. The developing trends of the lateral LED and the vertical LED which apply the wire-bonding packaging technology, and the flip-chip LED which applies the flip-chip packaging technology both are brightness improvement, volume reduction, and reliability improvement.

For the flip-chip packaging technology, a chip scale light-emitting diode packaging structure has been developed, which can achieve the purpose of miniaturization of the whole volume through appropriate structural designs. However, for the light-emitting diode package structure fabricated with the chip scale packaging technology, there are still great demands of improving the performances in terms of brightness, volume, light emitting angle, etc.

SUMMARY

The present invention relates to a light emitting package structure.

According to a concept of the present invention, a light emitting package structure is provided, which comprises a light emitting unit, a reflective layer, a reflective element and an optical layer. The light emitting unit has a top surface, a bottom surface and sidewall surfaces. The bottom surface and the top surface are opposing to each other. The sidewall surfaces are between the top surface and the bottom surface. The light emitting unit further has an electrode portion on the bottom surface. The reflective layer encloses the sidewall surfaces of the light emitting unit. The reflective element is disposed on the light emitting unit and the reflective layer. The optical layer comprises a phosphor layer, a light diffusion layer or a combination thereof. The optical layer is disposed between the top surface of the light emitting unit and the reflective element.

According to an embodiment, the electrode portion of the light emitting unit is exposed by an external surface of the light emitting package structure.

According to an embodiment, a top surface of the reflective layer is substantially level with the top surface of the light emitting unit.

According to an embodiment, the light emitting package structure further comprises a light blocking layer disposed on the reflective element.

According to an embodiment, the reflective element has one or more reflective extension portions covering a portion of a sidewall surface of the optical layer and a portion of a sidewall surface of the reflective layer.

According to an embodiment, the one or more reflective extension portions cover one surface, two surfaces or three sidewall surfaces of the optical layer.

According to an embodiment, the light blocking layer has one or more light blocking extension portions covering the one or more reflective extension portions.

According to an embodiment, a lateral size of the light blocking layer and the reflective element becomes smaller gradually along a direction from a bottom of the reflective element to a top of the light blocking layer.

According to an embodiment, the light emitting unit comprises a blue LED chip.

According to an embodiment, the light emitting package structure further comprises one or more additional light emitting units.

According to an embodiment, the one or more additional light emitting units are a red LED chip, a green LED chip or a combination thereof.

According to an embodiment, the reflective layer encloses sidewall surfaces of the one or more additional light emitting units.

According to an embodiment, a transmittance of the light diffusion layer is 99% or higher.

According to an embodiment, the reflective element and the reflective layer have a light reflectance of 95% or higher.

According to another concept of the present invention, a light emitting package structure is provided, which comprises a light emitting unit, a reflective layer, an optical layer and a light blocking layer. The light emitting unit has a top surface, a bottom surface and sidewall surfaces. The bottom surface and the top surface are opposing to each other. The sidewall surfaces are disposed between the top surface and the bottom surface. The light emitting unit further has an electrode portion on the bottom surface. The reflective layer encloses the sidewall surfaces of the light emitting unit. The optical layer comprises a phosphor layer, a light diffusion layer or a combination thereof. The optical layer is disposed on the top surface of the light emitting unit. The light blocking layer encloses a sidewall surface of the optical layer.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements. The term "substantially level with" described herein permits an industry-accepted tolerance such as within 10%, or within 5%, or within 3%, or within 2%, or within 1%, or within 0.5%.

Figure 1:
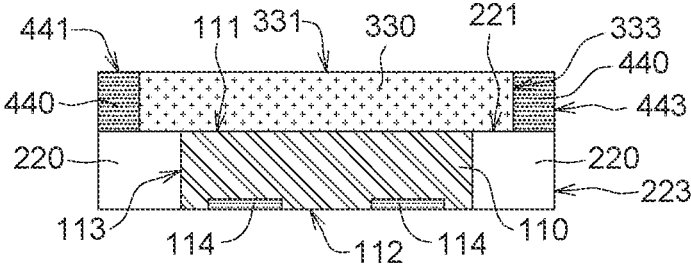
FIG. 1 is a light emitting package structure in an embodiment.

As shown in FIG. 1, a light emitting package structure comprises a light emitting unit 110, a reflective layer 220, an optical layer 330 and a light blocking layer 440.

The light emitting unit 110 has a top surface 111, a bottom surface 112 and sidewall surfaces 113. The sidewall surfaces 113 are between the top surface 111 and the bottom surface 112. The light emitting unit 110 may be a flip chip, and has electrode portions 114 on the bottom surface 112. In an embodiment, the light emitting unit 110 comprises a light emitting diode (LED) chip such as a blue LED chip.

In embodiments, the light emitting package structure is a chip scale package (CSP) structure. The electrode portions 114 of the light emitting unit 110 may be exposed by an external surface of the light emitting package structure. The electrode portions 114 of the light emitting unit 110 are not covered by a substrate. The electrode portions 114 are an electrode pair used for providing an electrical connection to an external circuit for driving the light emitting unit 110.

In embodiments, the light emitting package structure is not limited to a chip scale package structure. In another embodiment, the light emitting package structure may further comprise a substrate (not shown), and the light emitting unit 110 and the reflective layer 220 are disposed on a top surface of the substrate. The electrode portions 114 of the light emitting unit 110 may be electrically connected to an external circuit through conductive elements of the substrate so as to drive the light emitting unit 110.

The reflective layer 220 encloses the sidewall surfaces 113 of the light emitting unit 110. The reflective layer 220 may enclose all of the sidewall surfaces 113 of the light emitting unit 110. For example, the light emitting unit 110 of a rectangular shape has four sidewall surfaces 113, and the reflective layer 220 is disposed on the four sidewall surfaces 113 of the light emitting unit 110. A top surface 221 of the reflective layer 220 and the top surface 111 of the light emitting unit 110 are substantially level with each other. The reflective layer 220 may be a resin mixture having a reflective particle, for example. In a preferred embodiment, the reflective layer 220 has a reflectance of 95% or higher to a light emitted from the light emitting unit 110, and therefore can effectively reflect a lateral light from the light emitting unit 110 to provide a better light collecting effect.

The optical layer 330 may be disposed on the top surface 111 of the light emitting unit 110 and the top surface 221 of the reflective layer 220. The optical layer 330 may comprise a phosphor layer, a light diffusion layer or a combination thereof. The phosphor layer can provide a wavelength converting effect to a light emitted from the light emitting unit 110 so as to provide a light having various colors different from a color of the light emitted from the light emitting unit 110 for the light emitting package structure. The light diffusion layer can provide a light equalizing effect. In an embodiment, the optical layer 330 is the phosphor layer. In another embodiment, the optical layer 330 is the phosphor layer and the light diffusion layer, wherein the phosphor layer is on the top surface 111 of the light emitting unit 110, and the light diffusion layer is on a top surface of the phosphor layer. In embodiments, the light diffusion layer of the optical layer 330 may have a transmittance of 99% or higher. A material of the light diffusion layer of the optical layer 330 may comprise silicon dioxide, titanium dioxide, boron nitride, etc.

The light blocking layer 440 is disposed on the top surface 221 of the reflective layer 220. The light blocking layer 440 encloses a sidewall surface 333 of the optical layer 330. A sidewall surface 443 of the light blocking layer 440 and a sidewall surface 223 of the reflective layer 220 are substantially level with each other. A top surface 441 of the light blocking layer 440 and a top surface 331 of the optical layer 330 are substantially level with each other. The light blocking layer may be a light absorbing element having a dark color or a black color, etc. The light blocking layer may have a light transmittance of 5% or lower. A material of the light blocking layer 440 may be a mixture of a resin and carbon black, for example. The light blocking layer 440 can block an emitting light of large angle, by which a contrast ratio of the arrayed light emitting package structures can be increased.

Figure 2:
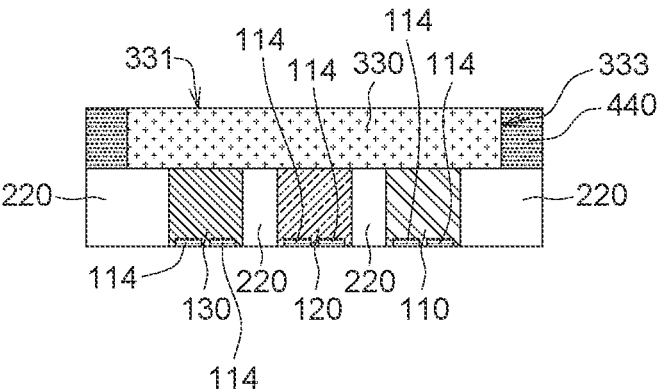
FIG. 2 is a light emitting package structure in an embodiment.

FIG. 2 illustrates a light emitting package structure, which is different from the light emitting package structure shown in FIG. 1 with the following description. The light emitting package structure further comprises a light emitting unit 120 and a light emitting unit 130. The light emitting unit 120 and the light emitting unit 130 may comprise light emitting diode chips. In an embodiment, the light emitting unit 110 is a blue LED chip, the light emitting unit 120 is a green LED chip, and the light emitting unit 130 is a red LED chip. Structures of the light emitting unit 120 and the light emitting unit 130 may be similar with the structure of the light emitting unit 110. For example, the light emitting unit 120 and the light emitting unit 130 may be flip chips, and have the electrode portions 114 on bottom surfaces of the light emitting unit 120 and the light emitting unit 130. In embodiments, the light emitting package structure is a chip scale package structure. The electrode portions 114 of the light emitting unit 120 and the light emitting unit 130 may be electrode pairs exposed by an external surface of the light emitting package structure, for providing an electrical connection to an external circuit for driving the light emitting unit 120 and the light emitting unit 130. The reflective layer 220 encloses the light emitting unit 110, the light emitting unit 120 and the light emitting unit 130. The light emitting unit 110, the light emitting unit 120 and the light emitting unit 130 are separated from each other by the reflective layer 220. The reflective layer 220 has a low light transmittance (such as lower than 5%), and can block light penetrating. Therefore, the reflective layer 220 can prevent from light interference between the light emitting unit 110, the light emitting unit 120 and the light emitting unit 130. The light emitting units of the light emitting package structure may have other quantities or other color arrangements for the light emitting chips. The optical layer 330 is disposed on the light emitting unit 110, the light emitting unit 120, the light emitting unit 130 and the reflective layer 220. In an embodiment, the optical layer 330 is the light diffusion layer. In another embodiment, the optical layer 330 is the phosphor layer and the light diffusion layer, wherein the phosphor layer is on the light emitting unit 110, the light emitting unit 120, the light emitting unit 130 and the reflective layer 220, and the light diffusion layer is on the top surface of the phosphor layer.

Figure 3:
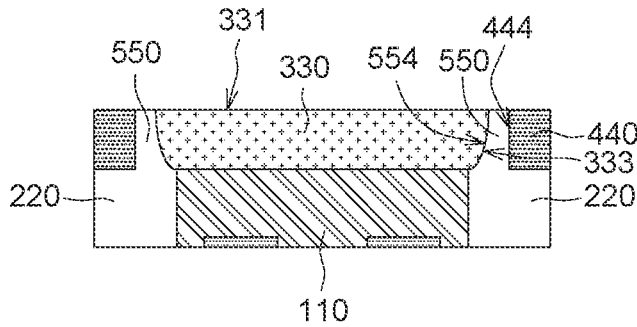
FIG. 3 is a light emitting package structure in an embodiment.

FIG. 3 illustrates a light emitting package structure, which is different from the light emitting package structure shown in FIG. 1 with the following description. The light emitting package structure further comprises a reflective element 550. The reflective element 550 may be adjoined on the reflective layer 220. The reflective element 550 is disposed between the sidewall surface 333 of the optical layer 330 and a sidewall surface 444 of the light blocking layer 440. Light extraction can be further increased by disposing the reflective element 550, and at the same time contrast ratio can be increased by the light blocking layer 440. A lateral cross-section area of the optical layer 330 becomes larger gradually from the bottom up. The sidewall surface 333 of the optical layer 330 may be a convex curved surface, and a sidewall surface 554 of the reflective element 550 may be a concave curved surface. By which a cup-shaped reflection effect can be generated to further increase light extraction.

In embodiments, the reflective layer 220 and the reflective element 550 are high-reflectance elements. Light reflectance of the reflective layer 220 and the reflective element 550 may be 95% or higher. A composition of the reflective layer 220 may be different from a composition of the reflective element 550. A material of the reflective layer 220 may comprise nano-scale titanium compound, or silicon compound, etc. A material of the reflective element 550 may comprise nano-scale titanium compound or silicon compound, etc.

Figure 4:
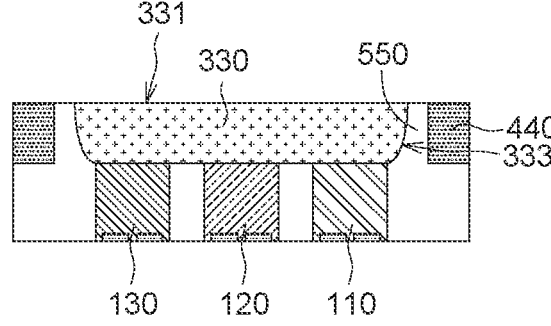
FIG. 4 is a light emitting package structure in an embodiment.

FIG. 4 illustrates a light emitting package structure, which is different from the light emitting package structure shown in FIG. 3 with the following description. Besides the light emitting unit 110, the light emitting package structure further comprises the light emitting unit 120 and the light emitting unit 130. The other similar concepts may be referred to the descriptions illustrated with referring to FIG. 2 and not repeated herein.

Figure 5:
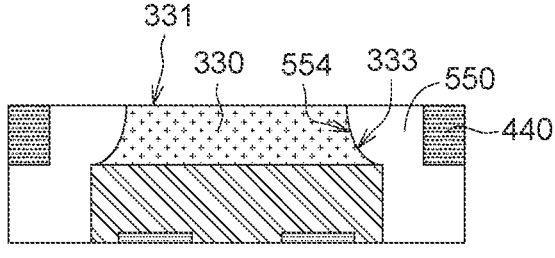
FIG. 5 is a light emitting package structure in an embodiment.

FIG. 5 illustrates a light emitting package structure, which is different from the light emitting package structure shown in FIG. 3 with the following description. A lateral cross-section area of the optical layer 330 becomes smaller from the bottom up. The sidewall surface 333 of the optical layer 330 may be a concave curved surface, and the sidewall surface 554 of the reflective element 550 may be a convex curved surface. By which, an area of an emitting light can be reduced, and an effect as a point light source can be approached.

Figure 6:
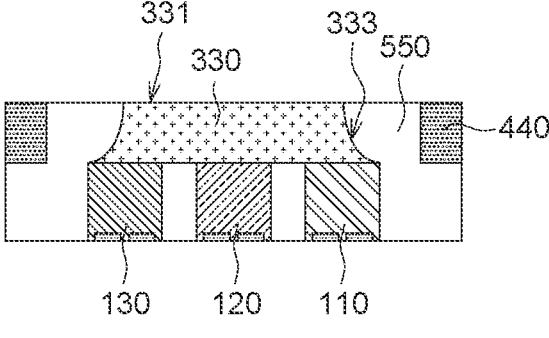
FIG. 6 is a light emitting package structure in an embodiment.

FIG. 6 illustrates a light emitting package structure, which is different from the light emitting package structure shown in FIG. 5 with the following description. Besides the light emitting unit 110, the light emitting package structure further comprises the light emitting unit 120 and the light emitting unit 130. The other similar concepts may be referred to the descriptions illustrated with referring to FIG. 2 and not repeated herein.

As shown in FIG. 1 to FIG. 2, the light blocking layer 440 of the light emitting package structure is disposed on the sidewall surface 333 of the optical layer 330. As shown in FIG. 3 to FIG. 6, the reflective element 550 and the light blocking layer 440 of the light emitting package structure are disposed on the sidewall surface 333 of the optical layer 330. The reflective element 550 and the light blocking layer 440 have low light transmittances (such as lower than 5%), by which a contrast ratio can be increased. Through this arrangement, a light emitted from the light emitting unit emits away the light emitting package structure mainly from the top surface 331 of the optical layer 330. The light emitting package structure is a top view type light emitting package structure. In embodiments, the optical layer 330 has a rectangular shape having four sidewall surfaces 333, and the light blocking layer 440, or both the light blocking layer 440 and the reflective element 550 are disposed on the four sidewall surfaces 333 of the optical layer 330. It can prevent a light emitted by the light emitting package structure from exciting a phosphor layer of an adjacent un-driven light emitting package structure that would affect a contrast ratio.

Figure 7:
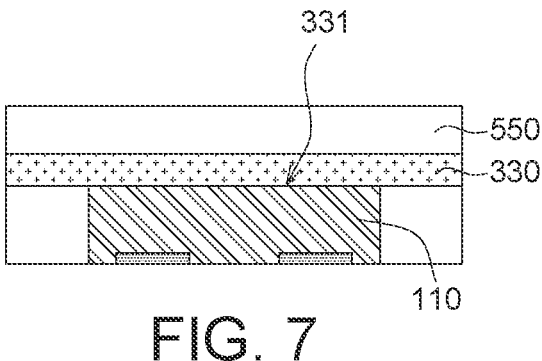
FIG. 7 is a light emitting package structure in an embodiment.

FIG. 7 illustrates a light emitting package structure, which is different from the light emitting package structure shown in FIG. 1 with the following description. The light emitting package structure further comprises the reflective element 550. The reflective element 550 has a film structure, and is disposed on the top surface 331 of the optical layer 330. The optical layer 330 and the reflective element 550 have a uniform lateral size. The reflective element 550 is a resin mixture having a reflective particle, preferably.

Figure 8:
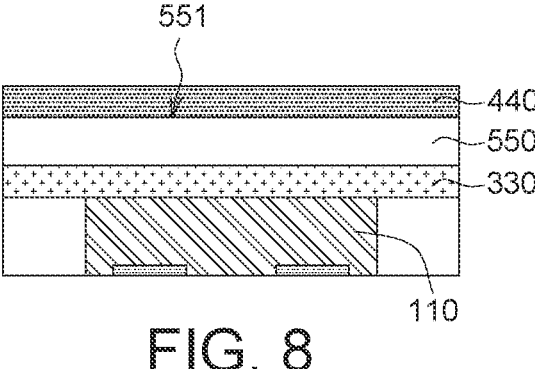
FIG. 8 is a light emitting package structure in an embodiment.

FIG. 8 illustrates a light emitting package structure, which is different from the light emitting package structure shown in FIG. 7 with the following description. The light emitting package structure further comprises the light blocking layer 440. The light blocking layer 440 is disposed on a top surface 551 of the reflective element 550. A lateral size of the light blocking layer 440 is identical with lateral sizes of the optical layer 330 and the reflective element 550. Disposing the light blocking layer 440 can prevent exciting a phosphor powder in the light emitting package structure by an incident light from an adjacent light source that would cause a cross talk problem.

Figure 9:
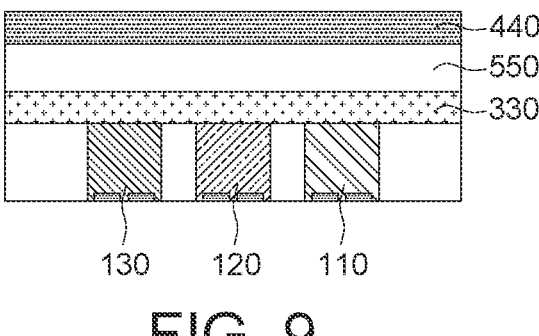
FIG. 9 is a light emitting package structure in an embodiment.

FIG. 9 illustrates a light emitting package structure, which is different from the light emitting package structure shown in FIG. 8 with the following description. Besides the light emitting unit 110, the light emitting package structure further comprises the light emitting unit 120 and the light emitting unit 130. The other similar concepts may be referred to the descriptions illustrated with referring to FIG. 2 and not repeated herein.

Figure 10:
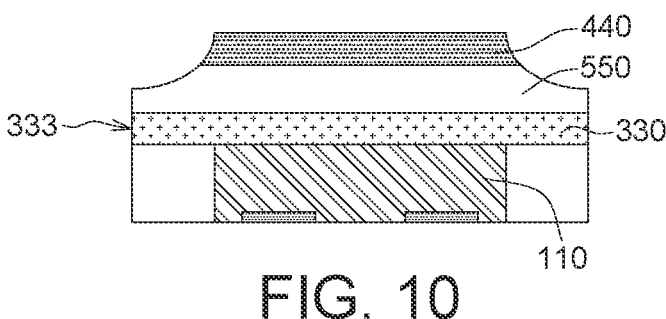
FIG. 10 is a light emitting package structure in an embodiment.

FIG. 10 illustrates a light emitting package structure, which is different from the light emitting package structure shown in FIG. 8 with the following description. Lateral sizes of the light blocking layer 440 and the reflective element 550 may be smaller than a lateral size of the optical layer 330. A lateral size of the light blocking layer 440 and the reflective element 550 becomes smaller gradually along a direction from a bottom of the reflective element 550 to a top of the light blocking layer 440.

Figure 11:
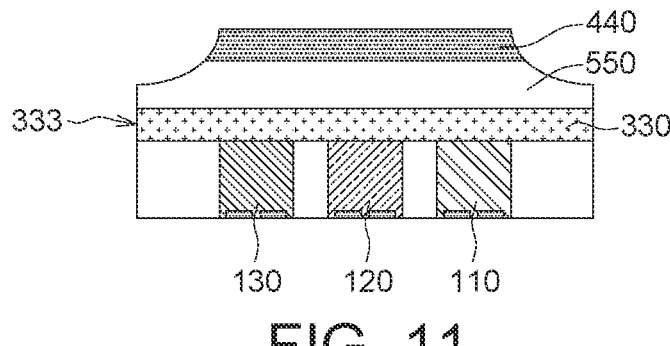
FIG. 11 is a light emitting package structure in an embodiment.

FIG. 11 illustrates a light emitting package structure, which is different from the light emitting package structure shown in FIG. 10 with the following description. Besides the light emitting unit 110, the light emitting package structure further comprises the light emitting unit 120 and the light emitting unit 130. The other similar concepts may be referred to the descriptions illustrated with referring to FIG. 2 and not repeated herein.

Figure 12:
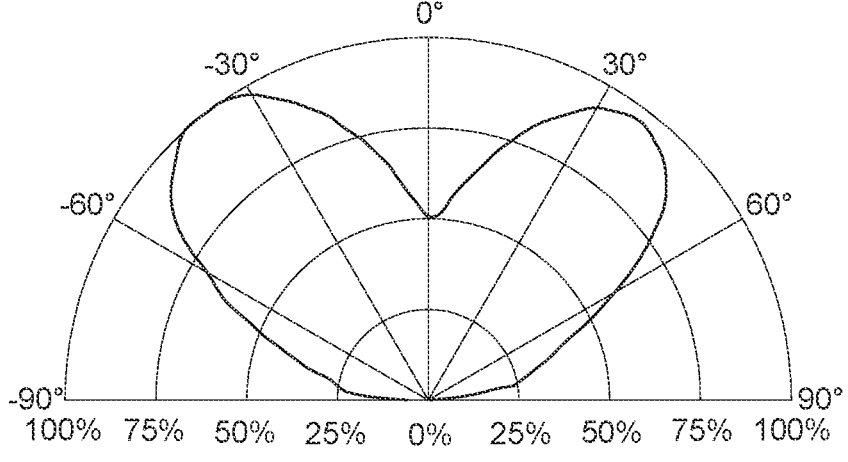
FIG. 12 shows a relation of a light emitting angle and a luminous intensity of a light emitting package structure in an embodiment.

As shown in FIG. 7, the light emitting package structure has the optical layer 330 disposed between the top surface of the light emitting unit (for example comprising the light emitting unit 110, but not limited thereto) and the bottom surface of the reflective element 550. As shown in FIG. 8 to FIG. 11, the light emitting package structure has the optical layer 330 disposed between the top surface of the light emitting unit (for example comprising the light emitting unit 110, the light emitting unit 120, and/or the light emitting unit 130) and the bottom surfaces of the reflective element 550 and the light blocking layer 440. Through this arrangement, a light emitted from the light emitting unit emits away the light emitting package structure mainly from the sidewall surface 333 of the optical layer 330, achieving a batwing type light distribution, as shown in FIG. 12. The light emitting package structure can have a big light emitting angle, such as about 170 degrees. In addition, the light emitting package structure may have a center luminous intensity of 30% to 70%. In an embodiment, the optical layer 330 has a rectangular shape having four sidewall surfaces 333, and a light emitted from the light emitting unit emits away the light emitting package structure from the four sidewall surfaces 333.

In other embodiments, the reflective element 550 may have a reflective extension portion 560. The reflective extension portion 560 covers a portion of the sidewall surface 333 of the optical layer 330 and a portion of the sidewall surface 223 of the reflective layer 220. Additionally/otherwise, the light blocking layer 440 may have a light blocking extension portion 470. The light blocking extension portion 470 covers a portion of the sidewall surface 333 of the optical layer 330 and a portion of the sidewall surface 223 of the reflective layer 220. The light blocking extension portion 470 of the light blocking layer 440 may cover the reflective extension portion 560 of the reflective element 550. A light emitted from the light emitting unit may emit away the light emitting package structure from the sidewall surface 333 of the optical layer 330 not covered by the reflective extension portion 560 and/or the light blocking extension portion 470. Light emitting package structures shown in FIG. 13, FIG. 14 and FIG. 15 are illustrated as examples.

Figure 13:
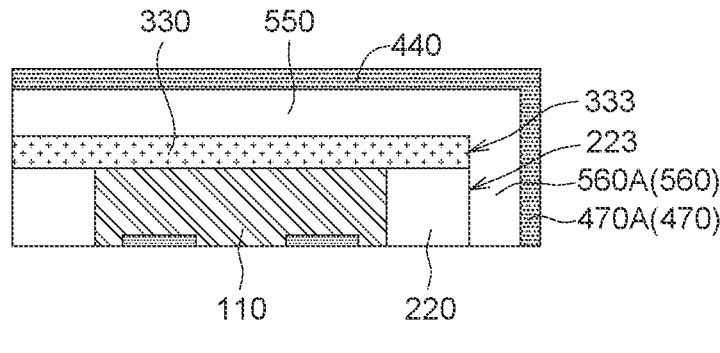
FIG. 13 is a light emitting package structure in an embodiment.

The light emitting package structure shown in FIG. 13 is different from the light emitting package structure shown in FIG. 8 with the following description. FIG. 13 shows one reflective extension portion 560A of the reflective extension portion 560 of the reflective element 550. FIG. 13 also shows one light blocking extension portion 470A of the light blocking extension portion 470 of the light blocking layer 440. The reflective extension portion 560A is on one sidewall surface 333 (right sidewall surface) of the optical layer 330. The light blocking extension portion 470A is on a sidewall surface of the reflective extension portion 560A. A light emitted from the light emitting unit 110 can emit away the light emitting package structure from the sidewall surface 333 (left sidewall surface) of the optical layer 330 not covered by the reflective extension portion 560A and the light blocking extension portion 470A.

Figure 14:
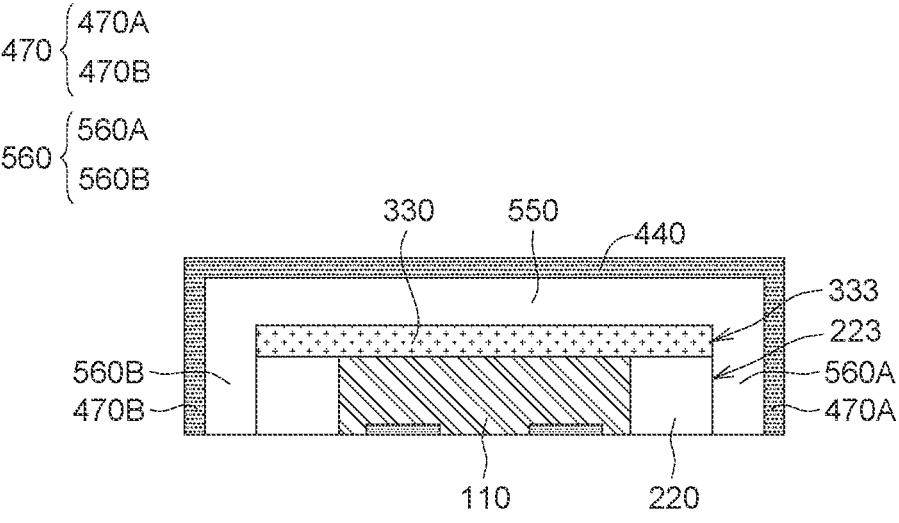
FIG. 14 is a light emitting package structure in an embodiment.

The light emitting package structure shown in FIG. 14 is different from the light emitting package structure shown in FIG. 13 with the following description. FIG. 14 shows two reflective extension portions (i.e. the reflective extension portion 560A and a reflective extension portion 560B) of the reflective extension portion 560. FIG. 14 also shows two light blocking extension portions (i.e. the light blocking extension portion 470A and a light blocking extension portion 470B) of the light blocking extension portion 470. The reflective extension portion 560A and the reflective extension portion 560B are on the opposing sidewall surfaces 333 of the optical layer 330 respectively. The reflective extension portion 560A and the reflective extension portion 560B are on the sidewall surfaces 223 of the reflective layer 220 on the opposing sidewall surfaces of the light emitting unit (comprising the light emitting unit 110, the light emitting unit 120, and/or the light emitting unit 130), respectively. The light blocking extension portion 470A and the light blocking extension portion 470B are on the sidewall surfaces of the reflective extension portion 560A and the reflective extension portion 560B, respectively.

Figure 15:
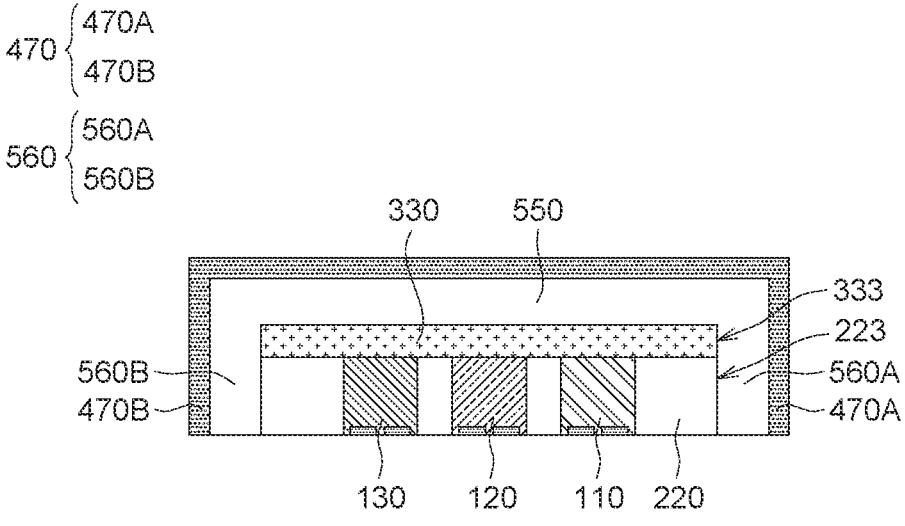
FIG. 15 is a light emitting package structure in an embodiment.

FIG. 15 illustrates a light emitting package structure, which is different from the light emitting package structure shown in FIG. 14 with the following description. Besides the light emitting unit 110, the light emitting package structure further comprises the light emitting unit 120 and the light emitting unit 130. The other similar concepts may be referred to the descriptions illustrated with referring to FIG. 2 and not repeated herein.

Figure 16:
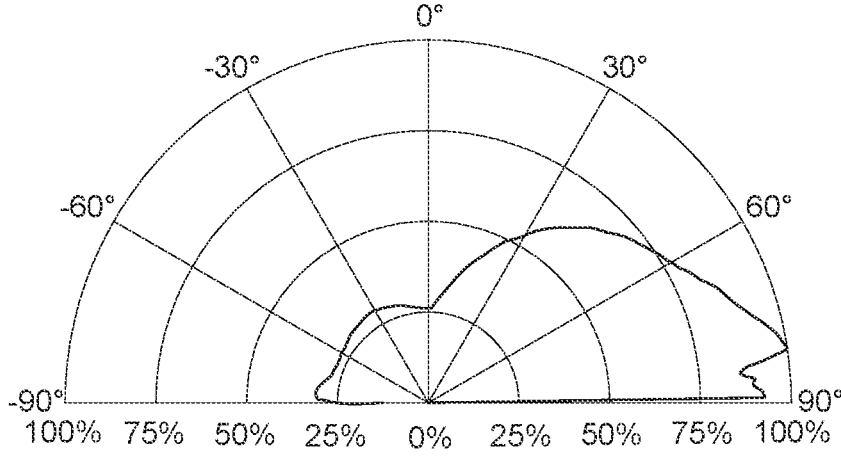
FIG. 16 shows a relation of a light emitting angle and a luminous intensity of a light emitting package structure in an embodiment.

The present invention is not limited to the above. For example, as the reflective layer 220 and the optical layer 330 have a rectangular shape having four sidewall surfaces (outer sidewall surfaces), the reflective element 550 may have one reflective extension portion 560 covering on one sidewall surface of the reflective layer 220 and the optical layer 330, and the light blocking layer 440 may have one light blocking extension portion 470 covering the sidewall surface of the one reflective extension portion 560, through this arrangement, a light emitted from the light emitting unit (comprising the light emitting unit 110, the light emitting unit 120, and/or the light emitting unit 130) may emit away the light emitting package structure from the other three sidewall surfaces 333 of the optical layer 330 not covered by the reflective extension portion 560 and the light blocking extension portion 470. Otherwise, as the reflective layer 220 and the optical layer 330 have a rectangular shape having four sidewall surfaces, the reflective element 550 may have two reflective extension portions 560 respectively covering on arbitrary two sidewall surfaces of the reflective layer 220 and the optical layer 330, and the light blocking layer 440 may have two light blocking extension portions 470 covering the sidewall surfaces of the two reflective extension portions 560, through this arrangement, a light emitted from the light emitting unit may emit away the light emitting package structure from the other two sidewall surfaces 333 of the optical layer 330 not covered by the reflective extension portions 560 and the light blocking extension portions 470. Alternatively, as the reflective layer 220 and the optical layer 330 have a rectangular shape having four sidewall surfaces, the reflective element 550 may have three reflective extension portions 560 respectively covering on arbitrary three sidewall surfaces of the reflective layer 220 and the optical layer 330, and the light blocking layer 440 may have three light blocking extension portions 470 covering the sidewall surfaces of the three reflective extension portions 560, through this arrangement, a light emitted from the light emitting unit may emit away the light emitting package structure from the other one sidewall surface 333 of the optical layer 330 not covered by the reflective extension portions 560 and the light blocking extension portions 470, which may have a luminous condition as shown in FIG. 16. The present invention is not limited thereto. The light emitting package structure of the invention can be varied according to actual demands such as a light output configuration, an amount of light emitting surface, etc.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting package structure, comprising:
   a light emitting unit having a top surface, a bottom surface opposing to the top surface, and sidewall surfaces between the top surface and the bottom surface, wherein the light emitting unit further has an electrode portion on the bottom surface;
   a reflective layer enclosing the sidewall surfaces of the light emitting unit;
   a reflective element disposed on the light emitting unit and the reflective layer, and having an upper surface and a lower surface opposite to the upper surface of reflective element;
   a light blocking layer disposed on the reflective element; and
   an optical layer having an upper surface and a lower surface opposite to the upper surface of the optical layer, wherein the optical layer comprises a phosphor layer, a light diffusion layer or a combination thereof,
   wherein, the lower surface of the reflective element fully covers and is in contact with the upper surface of the optical layer, thereby preventing the upper surface of the optical layer from being exposed, and the lower surface of the optical layer is in contact with the top surface of the light emitting unit.

2. The light emitting package structure according to claim 1, wherein the electrode portion of the light emitting unit is exposed by an external surface of the light emitting package structure.

3. The light emitting package structure according to claim 1, wherein a top surface of the reflective layer is substantially level with the top surface of the light emitting unit.

4. The light emitting package structure according to claim 1, wherein the reflective element has one or more reflective extension portions covering a portion of a sidewall surface of the optical layer and a portion of a sidewall surface of the reflective layer.

5. The light emitting package structure according to claim 4, wherein the one or more reflective extension portions cover one surface, two surfaces or three sidewall surfaces of the optical layer.

6. The light emitting package structure according to claim 5, wherein the light blocking layer has one or more light blocking extension portions covering the one or more reflective extension portions.

7. The light emitting package structure according to claim 1, wherein a lateral size of the light blocking layer and the reflective element becomes smaller gradually along a direction from a bottom of the reflective element to a top of the light blocking layer.

8. The light emitting package structure according to claim 1, wherein the light emitting unit comprises a blue LED chip.

9. The light emitting package structure according to claim 8, further comprising one or more additional light emitting units.

10. The light emitting package structure according to claim 9, wherein the one or more additional light emitting units are a red LED chip, a green LED chip or a combination thereof.

11. The light emitting package structure according to claim 9, wherein the reflective layer encloses sidewall surfaces of the one or more additional light emitting units.

12. The light emitting package structure according to claim 1, wherein a transmittance of the light diffusion layer is 99% or higher.

13. The light emitting package structure according to claim 1, wherein the reflective element and the reflective layer have a light reflectance of 95% or higher.

14. The light emitting package structure according to claim 1, wherein the light blocking layer has an upper surface and a lower surface opposite to the upper surface of the light blocking layer, and the lower surface of the light blocking layer covers and is in contact with the upper surface of the reflective element.

* * * * *